(12) United States Patent
Lawson et al.

(10) Patent No.: US 7,385,424 B2
(45) Date of Patent: Jun. 10, 2008

(54) HIGH-SPEED DIFFERENTIAL RECEIVER

(75) Inventors: William Frederick Lawson, Vestal, NY (US); Devon Glenford Williams, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 11/171,723

(22) Filed: Jun. 30, 2005

(65) Prior Publication Data

US 2007/0008002 A1      Jan. 11, 2007

(51) Int. Cl.
*H03K 19/0175* (2006.01)
*H03K 19/094* (2006.01)

(52) U.S. Cl. .............................. 326/82; 326/86; 326/87

(58) Field of Classification Search .................. 326/82, 326/86–87
See application file for complete search history.

(56) References Cited

U.S. PATENT DOCUMENTS

| | | | | |
|---|---|---|---|---|
| 5,606,268 A | * | 2/1997 | Van Brunt | 326/68 |
| 6,064,226 A | * | 5/2000 | Earl | 326/68 |
| 6,225,833 B1 | * | 5/2001 | Brown | 327/52 |
| 6,617,878 B2 | * | 9/2003 | Brownlow et al. | 326/68 |
| 6,825,692 B1 | * | 11/2004 | Chung et al. | 326/68 |
| 2001/0004219 A1 | * | 6/2001 | Bangs et al. | 327/65 |
| 2001/0047449 A1 | * | 11/2001 | Wada | 711/104 |
| 2004/0046604 A1 | * | 3/2004 | Kim | 327/536 |
| 2004/0189386 A1 | * | 9/2004 | Nishimura | 330/253 |

* cited by examiner

*Primary Examiner*—Rexford Barnie
*Assistant Examiner*—Matthew C Tabler
(74) *Attorney, Agent, or Firm*—Joan Pennington

(57) ABSTRACT

A high-speed differential receiver is used between a high voltage domain and a low voltage domain. The high-speed differential receiver includes a common mode differential amplifier coupled to a differential level shifter. The common mode differential amplifier and differential level shifter operates at the high voltage domain. The differential level shifter receives amplified differential signals from the common mode differential amplifier and provides voltage level shifted differential signals applied to a biased differential amplifier operating at the low voltage domain.

5 Claims, 5 Drawing Sheets

HIGH-SPEED DIFFERENTIAL RECEIVER

FIELD OF THE INVENTION

The present invention relates generally to the data processing field, and more particularly, relates to a high-speed differential receiver used between a high voltage domain and a low voltage domain.

DESCRIPTION OF THE RELATED ART

Interconnect architecture must continue evolving to meet increasing speed and high performance requirements of embedded systems. The interconnect architecture is an open standard which addresses the needs of a wide variety of embedded infrastructure applications, such as microprocessors, memory and memory mapped input/output (I/O) devices.

These applications are used in networking equipment, storage subsystems and general purpose computing platforms. One significant problem within the industry today is the inability to go from a high voltage domain to a low voltage domain with acceptable jitter.

A need exists for an improved high-speed differential receiver used between a high voltage domain and a low voltage domain providing acceptable performance including acceptable jitter, for example, at a frequency of 1.1 GHz.

SUMMARY OF THE INVENTION

A principal aspect of the present invention is to provide a high-speed differential receiver. Other important aspects of the present invention are to provide such high-speed differential receiver substantially without negative effect and that overcome many of the disadvantages of prior art arrangements.

In brief, a high-speed differential receiver is used between a high voltage domain and a low voltage domain. The high-speed differential receiver includes a common mode differential amplifier coupled to a differential level shifter. The common mode differential amplifier and differential level shifter operate at the high voltage domain. The differential level shifter receives amplified differential signals from the common mode differential amplifier and provides voltage level shifted differential signals applied to a biased differential amplifier operating at the low voltage domain.

In accordance with features of the invention, the differential level shifter includes a pair of P-channel field effect transistors (PFETs), each PFET receiving a gate input of a respective one of the amplified differential output signals from the common mode differential amplifier. Each of the PFETs is series connected with a respective N-channel field effect transistor (NFET) between the high voltage supply and ground. A gate of each respective NFET is cross connected to a common drain connection of the other series connect PFET and NFET.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
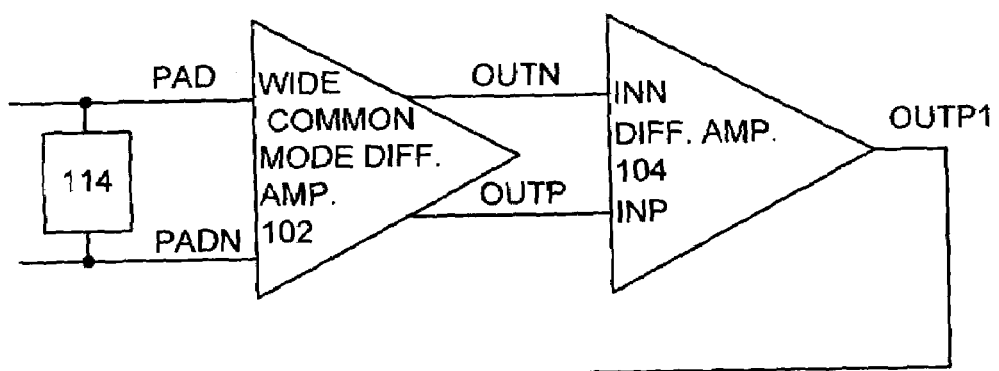
FIG. 1 is a schematic diagram illustrating an exemplary high-speed differential receiver in accordance with the preferred embodiment.
Figure 1:
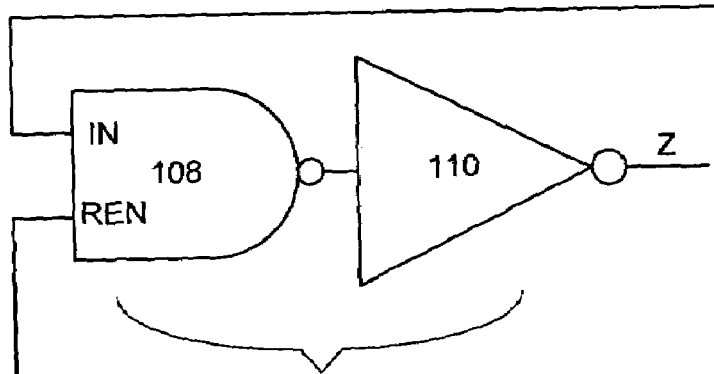

Having reference now to the drawings, in FIG. 1, there is shown an exemplary high-speed differential receiver generally designated by the reference character 100 in accordance with the preferred embodiment. Differential receiver 100 includes a wide common mode differential amplifier 102, a biased differential amplifier 104, and a NAND INVERT 106 including a NAND 108 and an Invert 110. Differential receiver 100 is implemented with complementary metal oxide semiconductor (CMOS) devices, such as CMOS field effect transistors (FETs), as shown in FIGS. 2A and 2B, FIG. 3 and FIG. 4

Figure 2A:
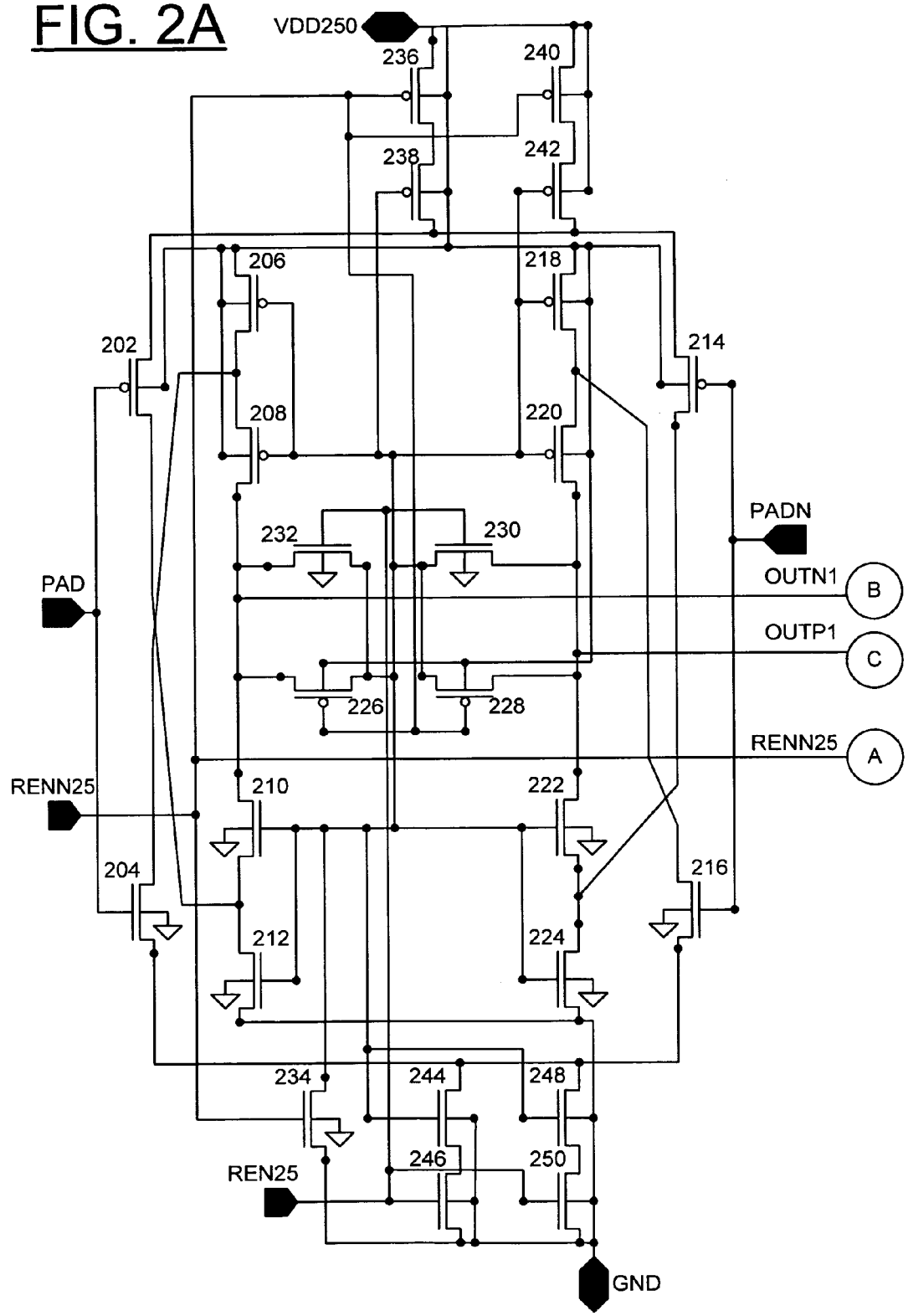
FIGS. 2A and 2B are schematic diagrams respectively illustrating an exemplary wide common mode differential amplifier and an exemplary differential level shifter of the high-speed differential receiver of FIG. 1 in accordance with the preferred embodiment.
Figure 2B:
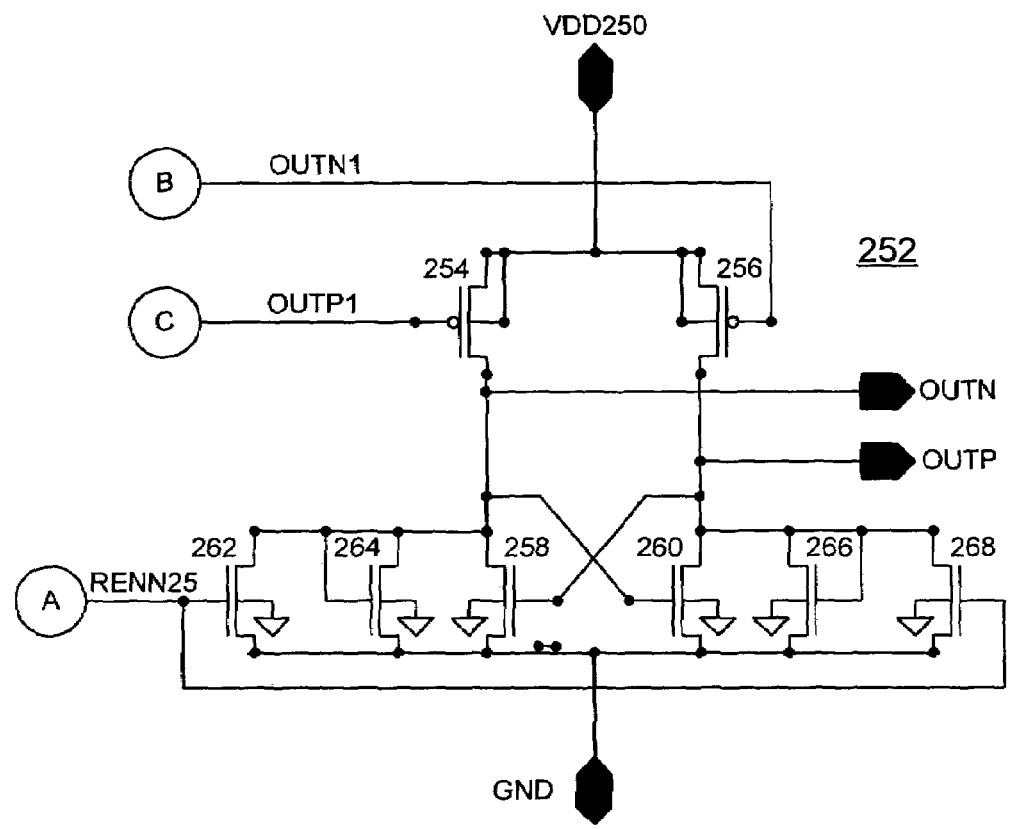

Wide common mode differential amplifier 102 is illustrated and described with respect to FIG. 2A and includes a differential level shifter 252 illustrated and described with respect to FIG. 2B. Wide common mode differential amplifier 102 receives differential inputs PAD, PADN and differential level shifter 252 provides level shifted, stabilized differential output signals OUTN, OUTP. The biased differential amplifier 104 receives differential inputs INN, INP corresponding to level shifted, stabilized differential output signals OUTN, OUTP and provides an output signal OUTP1. The biased differential amplifier 104 is illustrated and described with respect to FIG. 3. NAND INVERT 106 is illustrated and described with respect to FIG. 4. Differential receiver 100 includes a terminator 114 connected between differential inputs PAD, PADN to the wide common mode differential amplifier 102.

In accordance with features of the preferred embodiment, differential receiver 100 is a non-inverting differential high-speed receiver including the terminator 114 for interfacing off-chip unidirectional buses with a native low voltage VDD internal logic. Differential receiver 100 solves the problem of jitter and provides a receiver for high frequency operation with the ability to level-shift an IO with high voltage domain of 2.3 Volts to a core low voltage of 0.8 Volt under worst case conditions of process and temperature, while maintaining performance.

In accordance with features of the preferred embodiment, differential receiver 100 operates at a maximum frequency of 1.1 GHz with acceptable jitter and delays. High-speed differential receiver 100 uses an on-chip differential terminator 114, for example, of 100 ohms between PAD and PADN. The performance is optimized and guaranteed to meet design specification over a high voltage supply VDD250 range of 2.3-2.7 V and a low voltage supply VDD range of 0.8-1.3 V. Differential receiver 100 provides advantages of a differential level shifter from a high 2.3 V to a low logic core voltage at high frequency, low jitter and a wide common mode differential in combination.

As shown in FIGS. 2A and 2B, FIG. 3 and FIG. 4, the P-channel field effect transistors (PFETs) have a body connection to a voltage supply rail and the N-channel field effect transistors (NFETs) have a body connection to ground. However, it should be understood that the present invention is not limited to the illustrated arrangement.

Referring now to FIGS. 2A and 2B there are shown respectively, an exemplary wide common mode differential amplifier 102 and an exemplary differential level shifter generally designated by the reference character 252 of the high-speed differential receiver 100 in accordance with the preferred embodiment. Wide common mode differential amplifier 102 receives differential inputs PAD, PADN and provides amplified signal outputs OUTN1, OUTP1.

As shown in FIG. 2A, the wide common mode differential amplifier 102 includes a P-channel field effect transistor (PFET) 202 and an N-channel field effect transistor (NFET) 204 having a gate input receiving the differential input PAD. A pair of series connected PFETs 206, 208 and a pair of series connected NFETs 210, 212 are connected in series between a high voltage rail VDD250 and ground GND. A drain of PFET 202 is connected at the source and drain connection of NFETs 210, 212. A drain of NFET 204 is connected at the drain and source connection of PFETs 206, 208.

Wide common mode differential amplifier 102 includes a PFET 214 and an NFET 216 having a gate input receiving the differential input PADN. A pair of series connected PFETs 218, 220 and a pair of series connected NFETs 222, 224 are connected in series between the high voltage rail VDD250 and ground GND. A drain of PFET 214 is connected at the source and drain connection of NFETs 222, 224. A drain of NFET 216 is connected at the drain and source connection of PFETs 218, 220.

Wide common mode differential amplifier 102 includes a first pair of PFETs 226, 228 having a common gate connection and a second pair of NFETs 230, 232 having a common gate connection. PFET 226 and NFET 232 are parallel connected between the common drain connection of series connected PFET 208 and NFET 210 and a common gate connection of PFETs 206, 208, 218, 220 and NFETs 210, 212, 222, 224. PFET 228 and NFET 230 are parallel connected between the common drain connection of series connected PFET 220 and NFET 222 and the common gate connection of PFETs 206, 208, 218, 220 and NFETs 210, 212, 222, 224.

Wide common mode differential amplifier 102 includes a NFET 234 connected between the common gate connection of PFETs 206, 208, 218, 220 and NFETs 210, 212, 222, 224 and ground. Wide common mode differential amplifier 102 includes a first pair of PFETs 236, 238 and a second pair of PFETs 240, 242, each pair connected in series between the high voltage rail VDD250 and a source of both PFETs 202, 214. Wide common mode differential amplifier 102 includes a first pair of NFETs 244, 246 and a second pair of NFETs 248, 250, each pair connected in series between ground GND and a source of both NFETs 204, 216. A common input is connected to a respective gate of PFETs 238, 242, 218, 220, 206, 208 and NFETs 210, 212, 222, 224, 244, 248. A respective gate of NFETs 246, 250 receiving a receiver (2.5 Volt) enable gate input REN25 is connected to the gates of NFETs 230, 232. An inverted receiver enable gate input RENN25 is applied to a gate input to NFET 234 that is connected to a gate of PFETs 236, 240 and to the gate of PFETs 226, 228.

A gate input to NFET 234, PFETs 236, 240, 226, 228 receiving the inverted receiver enable gate input RENN25 is connected to an input labeled A to the differential level shifter 252 in FIG. 2B. Output ONTN1 of the wide common mode differential amplifier 102 is provided the common drain connection of series connected PFET 208 and NFET 210. Output ONTP1 of the wide common mode differential amplifier 102 is provided the common drain connection of series connected PFET 220 and NFET 222. Outputs OUTN1, OUTP1 are respectively applied to the differential level shifter 252 respectively indicated as an input labeled B and an input labeled C in FIG. 2B. The high voltage rail VDD250 and ground GND of the wide common mode differential amplifier 102 are common to the differential level shifter 252 in FIG. 2B.

Referring to FIG. 2B, the differential level shifter 252 includes a pair of PFETs 254, 256 respectively receiving a gate input of OUTP1, OUTN1. PFETs 254, 256 are series connected with a respective NFET 258 and NFET 260 between the high voltage supply rail VDD250 and ground. The gate of NFETs 258 and 260 are cross-connected to the drain of the NFETs. As shown, a gate of NFET 258 is connected to the common drain connection of the series connect PFET 256 and NFET 260. A gate of NFET 260 is connected to the common drain connection of the series connect PFET 254 and NFET 258. A pair of NFETs 262, 264 are parallel connected with NFET 258 and a pair of NFETs 266, 268 are parallel connected with NFET 260. The gate input from NFET 234, PFETs 236, 240, 226, 228 of the wide common mode differential amplifier 102 at input A in FIG. 2B is applied to the gate of NFET 262, 268. A gate and drain of NFET 264 is connected to the common drain connection of NFETs 258, 262. A gate and drain of NFET 266 is connected to the common drain connection of NFETs 260, 268. A common drain connection of PFETs 254, 256 and NFETs 258, 260, 262, 264, 266, 268 respectively provide the level shifted outputs OUTN, OUTP.

Figure 3:
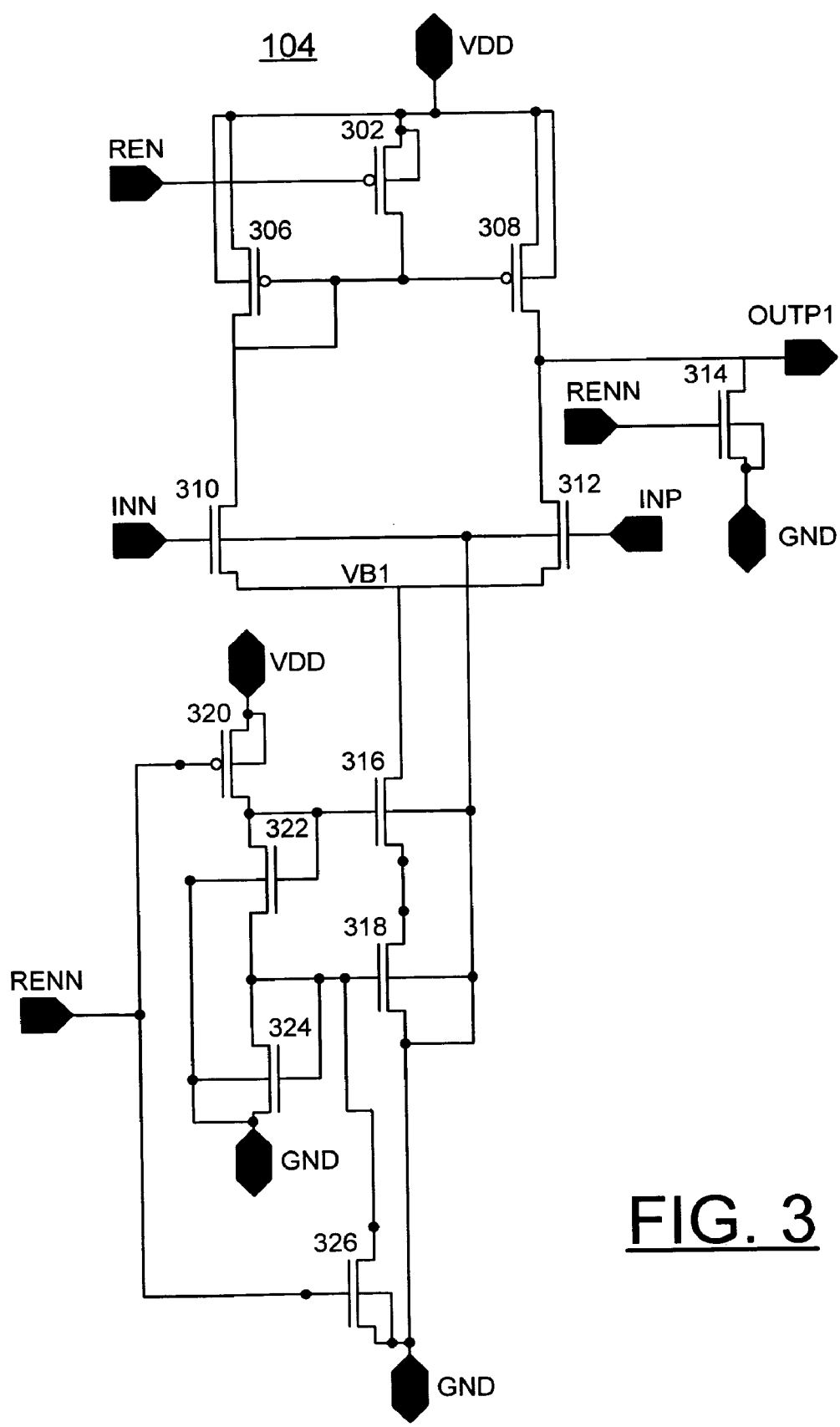
FIG. 3 is a schematic diagram illustrating an exemplary biased differential amplifier of the high-speed differential receiver of FIG. 1 in accordance with the preferred embodiment.

Referring to FIG. 3, there is shown an exemplary biased differential amplifier 104 of the high-speed differential receiver 100 in accordance with the preferred embodiment. Biased differential amplifier 104 receives the level shifted outputs OUTN, OUTP from the differential level shifter 252 at the inputs labeled INN, INP. Biased differential amplifier 104 includes the low voltage supply VDD. Biased differential amplifier 104 includes a PFET 302 receiving an enable gate input REN and connected between the low voltage supply VDD and a gate of a pair of PFETs 306, 308. PFETs 306, 308 are connected in series with a pair of NFETs 310, 312 between the low voltage supply VDD and a node VB1. The level shifted outputs OUTN, OUTP from the differential level shifter 252 at the inputs INN, INP are respectively applied to a gate of NFETs 310, 312. The common drain connection of PFET 308 and NFET 312 provides the output at a node OUTP1 of the biased differential amplifier 104.

Biased differential amplifier 104 includes an NFET 314 having an inverted enable gate input RENN and connected between the output OUTP1 and ground. A pair of NFETs 316, 318 is connected in series between node VB1 and ground. A transistor stack of a PFET 320, NFETs 322, 324 is connected between the low voltage supply VDD and ground. Each of NFETs 322, 324 has a gate and a drain common connection. A common drain connection of the series connected PFET 320 and NFET 322 provides a gate input to NFET 316. A source and drain connection of the series connected NFETs 322, 324 provides a gate input to NFET 318. An NFET 326 is connected between the source and drain connection of NFETs 322, 324 and ground and has a common gate connection with PFET 320 receiving the inverted enable gate input RENN. Biased differential amplifier 104 biases current swings at the low voltage VDD providing output OUTP1 when enabled by the enable input REN.

Figure 4:
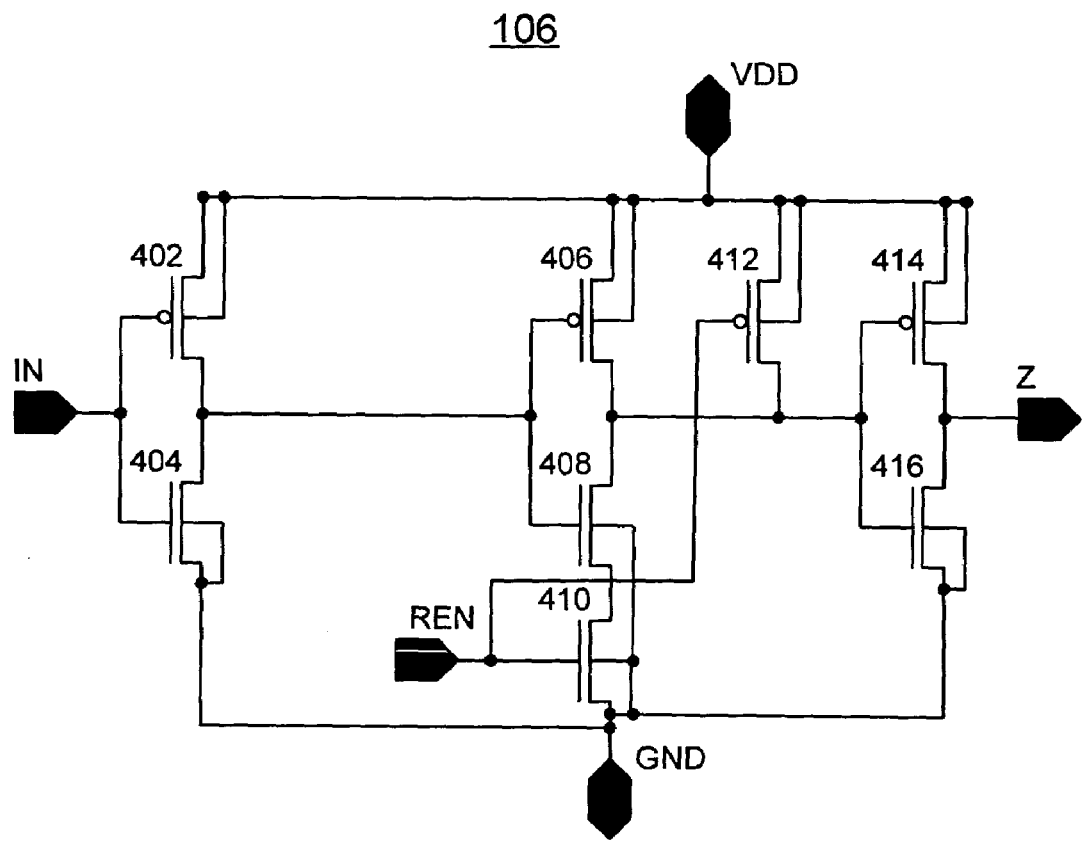
FIG. 4 is a schematic diagram illustrating an exemplary NAND INVERT of the high-speed differential receiver of FIG. 1 in accordance with the preferred embodiment.

Referring to FIG. 4, there is shown an exemplary NAND INVERT 106 of the high-speed differential receiver 100 in accordance with the preferred embodiment. NAND INVERT 106 includes an input inverter defined by a series connected PFET 402 and NFET 404 is connected between the low voltage VDD and ground. The output OUTP1 of the biased differential amplifier 104 is applied to the common gate connection of PFET 402 and NFET 404 at an input labeled IN. NAND INVERT 106 includes a transistor stack of PFET 406, NFETs 408, 410 connected between the low voltage VDD and ground. The inverter output at the common drain connection of PFET 402 and NFET 404 is applied to a gate of the PFET 406 and NFET 408. NAND INVERT 106 includes a PFET 412 connected between the low voltage VDD and a common drain connection of PFET 406 and NFET 408. An enable input REN is applied to the gate of PFET 412 and NFET 410. NAND INVERT 106 includes an output inverter defined by a series connected PFET 414 and NFET 416 is connected between the low voltage VDD and ground. NAND INVERT 106 includes an output Z provided at the common drain connection of PFET 414 and NFET 416.

While the present invention has been described with reference to the details of the embodiments of the invention shown in the drawing, these details are not intended to limit the scope of the invention as claimed in the appended claims.

What is claimed is:

1. A high-speed differential receiver used between a high voltage domain and a low voltage domain; said high-speed differential receiver comprising:

a common mode differential amplifier receiving differential input signals and providing amplified differential output signals;

a differential level shifter coupled to said common mode differential amplifier; said common mode differential amplifier and differential level shifter operating at the high voltage domain; said differential level shifter including a first pair of first P-channel field effect transistors (PFETs) connected to the high voltage domain supply;

each said first PFET of said first pair of PFETs of said differential level shifter being connected to the common mode differential amplifier and respectively receiving a gate input of a respective one of said amplified differential output signals from the common mode differential amplifier, each said first PFET being series connected with a respective first N-channel field effect transistor (NFET) between the high voltage domain supply and ground, a gate of each said first NFET is cross connected to a common drain connection of the other series connected first PFET and first NFET, a pair of N-channel field effect transistors (NFETs) connected in parallel with each said first NFET, and a respective common drain connection of each said first PFET and said respective first NFET respectively providing a drain output of a respective voltage level shifted differential signals;

a biased differential amplifier operating at the low voltage domain and coupled to said differential level shifter receiving said voltage level shifted differential signals and an enable signal for providing a biased output signal; said biased differential amplifier including a second pair of second P-channel field effect transistors (PFETs) connected to the low voltage domain supply; each said second PFET of said second pair of PFETs having a gate input enabled responsive to said enable signal and each said second PFET of said second pair of PFETs being series connected with a respective second N-channel field effect transistor (NFET) between the low voltage domain supply and a voltage bias node;

said biased differential amplifier including a series-connected pair of third N-channel field effect transistors (NFETs) connected in series between said voltage bias node and ground; and a transistor stack including a series-connected third P-channel field effect transistor (PFET) and a fourth N-channel field effect transistors (NFET) and a parallel-connected pair of a fifth N-channel field effect transistor (NFET) and a sixth N-channel field effect transistor (NFET) connected in series between the low voltage domain supply and ground; said third P-channel field effect transistor (PFET) and said sixth N-channel field effect transistor (NFET) respectively receiving a gate input of an inverted enable siginal; and said third N-channel field effect transistors (NFETs) respectively receiving a gate input of a source and drain connection of the series-connected third P-channel field effect transistor (PFET) and fourth N-channel field effect transistors (NFET) and of a source and drain connection of the series-connected fourth N-channel field effect transistors (NFET) and said fifth N-channel field effect transistors (NFET);

said respective second NFET having a gate connected to said respective common drain connection of each said first PFET and said respective first NFET of said differential level shifter; and a common drain connection of one of said second PFET and said respective second NFET of said biased differential amplifier providing the biased output signal responsive to said enable signal.

2. A high-speed differential receiver as recited in claim 1 wherein said common mode differential amplifier is a wide common mode differential amplifier and the high voltage domain includes a range between 2.3 Volts and 2.7 Volts.

3. A high-speed differential receiver as recited in claim 2 wherein said biased differential amplifier operating at the low voltage domain includes a range between 0.8 Volts and 1.3 Volts.

4. A high-speed differential receiver as recited in claim 1 includes a NAND INVERT output stage coupled to said biased differential amplifier.

5. A high-speed differential receiver as recited in claim 1 includes a terminator connected between a pair of inputs of said common mode differential amplifier receiving said differential input signals.

* * * * *